United States Patent
Terakado et al.

(10) Patent No.: US 6,674,502 B1
(45) Date of Patent: Jan. 6, 2004

(54) LIQUID CRYSTAL DISPLAY WITH NITRIDED INSULATING SUBSTRATE FOR TFT

(75) Inventors: Masatomo Terakado, Chiba (JP); Toshiki Kaneko, Chiba (JP); Takuya Takahashi, Hitachi (JP); Kenichi Chahara, Hitachi (JP); Kenichi Onisawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 204 days.

(21) Appl. No.: 09/715,961

(22) Filed: Nov. 16, 2000

(30) Foreign Application Priority Data

Nov. 19, 1999 (JP) .......................................... 11-329212

(51) Int. Cl.$^7$ ...................... G02F 1/1343; G02F 1/1333
(52) U.S. Cl. ..................... 349/147; 349/46; 349/158; 349/187; 349/138; 438/974; 438/30; 134/1.2
(58) Field of Search .................... 349/46, 147, 158, 349/187, 138; 438/974, 30; 134/1.2

(56) References Cited

U.S. PATENT DOCUMENTS

| | | | |
|---|---|---|---|
| 4,429,011 A | | 1/1984 | Kim et al. |
| 5,198,392 A | * | 3/1993 | Fukuda et al. ............... 438/769 |
| 5,327,001 A | * | 7/1994 | Wakai et al. ................ 257/350 |
| 5,492,843 A | * | 2/1996 | Adachi et al. .............. 438/479 |
| 6,144,082 A | * | 11/2000 | Yamazaki et al. ........... 257/412 |
| 6,219,125 B1 | * | 4/2001 | Ishikura et al. ............. 349/147 |
| 6,335,777 B1 | * | 1/2002 | Yokoyama et al. ......... 349/133 |
| 6,337,723 B1 | * | 1/2002 | Bae ............................ 349/43 |
| 6,414,738 B1 | * | 7/2002 | Fujikawa .................... 349/147 |
| 6,424,091 B1 | * | 7/2002 | Sawada et al. ......... 315/111.81 |

FOREIGN PATENT DOCUMENTS

| | | |
|---|---|---|
| JP | 9-162161 A | 6/1997 |
| JP | 10-161140 A | 6/1998 |

* cited by examiner

Primary Examiner—Robert H. Kim
Assistant Examiner—Andrew Schechter
(74) Attorney, Agent, or Firm—Townsend and Townsend and Crew LLP

(57) ABSTRACT

A liquid crystal display includes an insulative substrate having a surface treated with an oxygen plasma and a nitrogen-plasma-treated layer formed over said surface of said substrate. A surface of said nitrogen-plasma-treated layer has a nitrogen concentration of about 10 mol % or more.

12 Claims, 13 Drawing Sheets

LIQUID CRYSTAL DISPLAY WITH NITRIDED INSULATING SUBSTRATE FOR TFT

CROSS-REFERENCES TO RELATED APPLICATIONS

The present application is related to and claims priority from Japanese Patent Application No. 11-329212, filed Nov. 19, 1999.

BACKGROUND OF THE INVENTION

The present invention relates to a liquid crystal display device, and more particularly, to an insulative substrate on which to form interconnecting patterns for a liquid crystal display element using thin film transistors or the like as its switching elements as well as to a liquid crystal display element using such an insulative substrate.

In a semiconductor device such as an active matrix type of liquid crystal display element which uses thin film transistors (TFTs) as switching elements for its pixels, current paths such as interconnecting patterns or electrodes are formed over an insulative substrate out of conductive thin films.

In a liquid crystal display element in particular, with recent increases in its display area and in the scale of its integration, a reduction in the resistance of its internal interconnection lines has become an important subject. In a TFT type of liquid crystal display element, scanning signals and video signals are supplied from an end side of an interconnecting pattern, so that as the distance from a power feeding point becomes larger, distortions occur in signal waveforms due to the resistance values of interconnection lines, causing a display defect.

For this reason, investigation has been made into how a low-resistance material which can be substituted for chromium (Cr) which has heretofore been generally used is to be adopted as a material for forming interconnection lines or electrodes (hereinafter referred to as interconnection lines or the like). In addition, molybdenum (Mo) is known as one of promising candidates for materials which form metal films such as interconnection lines, from all possible points of view such as the degree of reduction in resistance value, adaptability to an etching process for patterning the interconnection lines and the like, the complexity of a manufacturing process, film stress and environment protection.

In general, the formation of this kind of interconnection line or the like is carried out by subjecting a conductive thin film formed over an insulative substrate (typically, a glass substrate in a liquid crystal display element) to mask exposure using a photosensitive resist, development and patterning using etching treatment, i.e., by using a photolithographic technique.

However, a film of Mo is disadvantageous in that the adhesion of the Mo film to a base substrate (such as a glass substrate in a liquid crystal display element or a silicon substrate in a semiconductor device such as a large-scale integrated circuit) is insufficient so that the Mo film easily peels from the base substrate, and in that if a resist is applied to the Mo film, the resist does not sufficiently adhere, and no desired etching accuracy is obtained. For this reason, it has heretofore been general that if Mo is to be used, another element is added to Mo to form a Mo alloy.

However, the formation of the alloy increases the resistance values of interconnection lines or the like, and causes an increase in the cost of a material such as a sputtering target which is used in a manufacturing process.

The defective adhesion of the metal film to the base substrate originates in the properties of the insulative substrate and the Mo film themselves as well as in the contamination of the surfaces of the insulative substrate and the Mo film. In general and in terms of surface contamination, treatments such as cleaning with various kinds of fluids and in-vacuum heating are performed before or after the formation of thin films such as interconnection lines.

In addition, for example, Japanese Patent Laid-Open No. 162161/1997 has a description to the effect that etching accuracy can be improved by performing surface reforming on a metal film by oxygen plasma ashing before the metal film is etched after the formation of a resist pattern. In terms of the properties of the film itself, although there is a method which uses an alloy of a high-melting point metal such as Mo, chromium (Cr) or tungsten (W), the structure described in U.S. Pat. No. 4,429,011 uses a method of nitriding the surface of a film of Mo and forming a nitride for surface stabilization. In addition, for example, Japanese Patent Laid-Open No. 161140/1998 describes a method of forming a nitride film on an interconnection film of a high-melting point metal for the purpose of reducing the pressure-contact resistance of connecting electrodes.

Although the prior-art pretreatment such as the cleaning of an insulative substrate and in-vacuum heating is generally performed by those skilled in the art, it cannot be said that the prior art can sufficiently remove contamination. The method described in Japanese Patent Laid-Open No. 162161/1997 performs oxygen plasma treatment after the formation of a resist pattern, but it is not clear whether this method contributes to the adhesion of a resist to an insulative substrate (substrate adhesion, i.e., base adhesion) and the adhesion of the resist.

In the method of forming a nitride layer (nitride film) on the surface of an insulative substrate as described in U.S. Pat. No. 4,429,011, after a Mo interconnecting pattern has been formed, the formed pattern is treated in ammonium atmosphere at 400–850° C., but it is not clear how a thin film forming element is influenced by the exposure of the insulative substrate to high temperatures.

In addition, the above-described prior art adopts a method which, after forming thin films such as interconnection lines on an insulative substrate, temporarily takes the insulative substrate out of a vacuum chamber, and performs treatment on the insulative substrate in a separate apparatus after exposing the insulative substrate to atmospheric air for a predetermined time. This method causes problems such as the risk of adsorption of atmospheric impurities to the surface of the insulative substrate, a reduction in production efficiency due to the use of the separate apparatus, and an increase in the cost of a manufacturing apparatus.

Moreover, in the method described in Japanese Patent Laid-Open No. 161140/1998, although it is asserted that the pressure-contact resistance can be restrained by the formation of the nitride film, it is not clear whether the substrate adhesion and the resist adhesion can be improved.

SUMMARY OF THE INVENTION

In one embodiment of the present invention, a liquid crystal display includes an insulative substrate having a surface treated with an oxygen plasma and a nitrogen-plasma-treated layer formed over said surface of said substrate. A surface of said nitrogen-plasma-treated layer has a nitrogen concentration of about 10 mol % or more.

In another embodiment, a liquid crystal display includes at least one glass substrate having a surface treated with an oxygen plasma. A protective layer is formed over the surface by igniting a nitrogen plasma over the surface. A conductive layer is formed over the protective layer, where the conductive layer includes a metallic element. A lower conductive layer is provided below the conductive layer, where the lower conductive layer has the metallic element and nitrogen atoms. An upper conductive layer is provided above the conductive layer, where the upper conductive layer has the metallic element and nitrogen atoms. The protective layer has a nitrogen concentration of about 10 mol % or more.

The present invention is not limited to any of the above-described constructions and embodiments which will be described below, and various modifications of the present invention can be made without departing from the technical ideas described in the appended claims.

BRIEF DESCRIPTION OF THE DRAWINGS

Preferred embodiments of the liquid crystal display device according to the present invention will be described below in detail with reference to the following drawings, wherein.

DESCRIPTION OF THE SPECIFIC EMBODIMENTS

Figure 1:
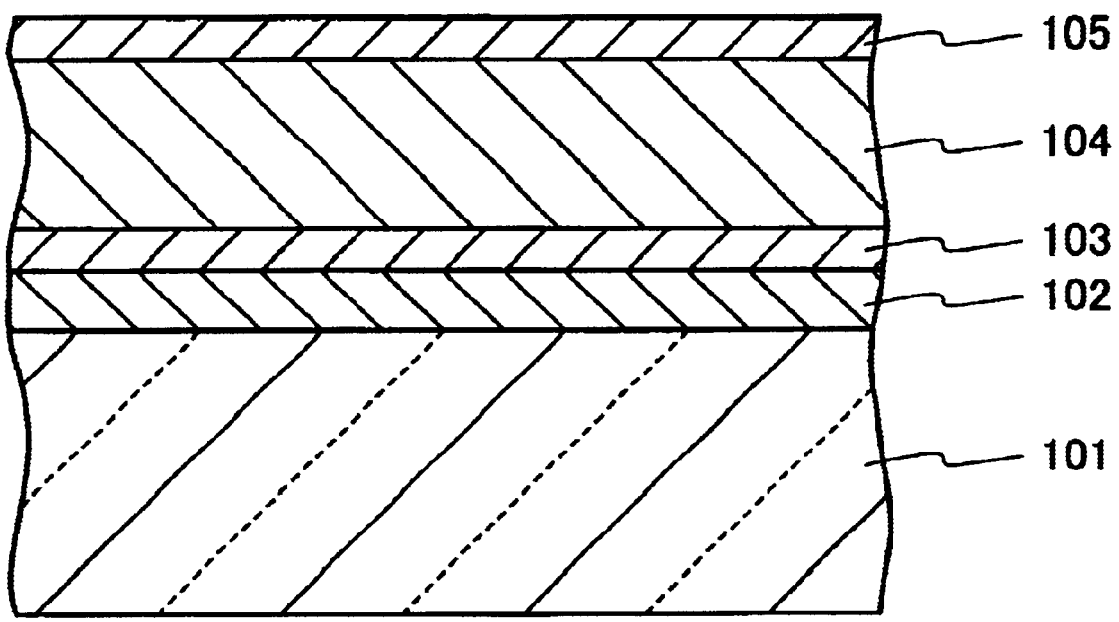
FIG. 1 is a diagrammatic cross-sectional view illustrating the structure of a conductive thin film formed over an insulative substrate.

Preferred embodiments of the present invention will be described below in detail with reference to drawings of the embodiments FIG. 1 is a diagrammatic cross-sectional view illustrating the structure of a conductive thin film formed over an insulative substrate, and shows one example of a thin film construction formed over a glass substrate 101 which serves as the insulative substrate. Referring to FIG. 1, a glass substrate 101 has a clean surface layer 102 with a plasma-treated surface, and a first molybdenum nitride layer (hereinafter referred to as the first Mo-N film) 103 is formed on the clean surface layer 102.

Moreover, a Mo thin film 104 is formed on the first Mo-N thin film 103, and a second molybdenum nitride layer (hereinafter referred to as the second Mo-N film) 105 is formed on the first Mo-N thin film 103. Specifically, the Mo thin film 104 is interposed between the underlying first Mo-N film 103 and the overlying second Mo-N film 105.

The Mo-N film has a form in which molybdenum nitride (such as $Mo_2N$) is dispersed in a matrix of Mo, and may also assume an amorphous state if the thickness of the Mo-N film is small.

Figure 2:
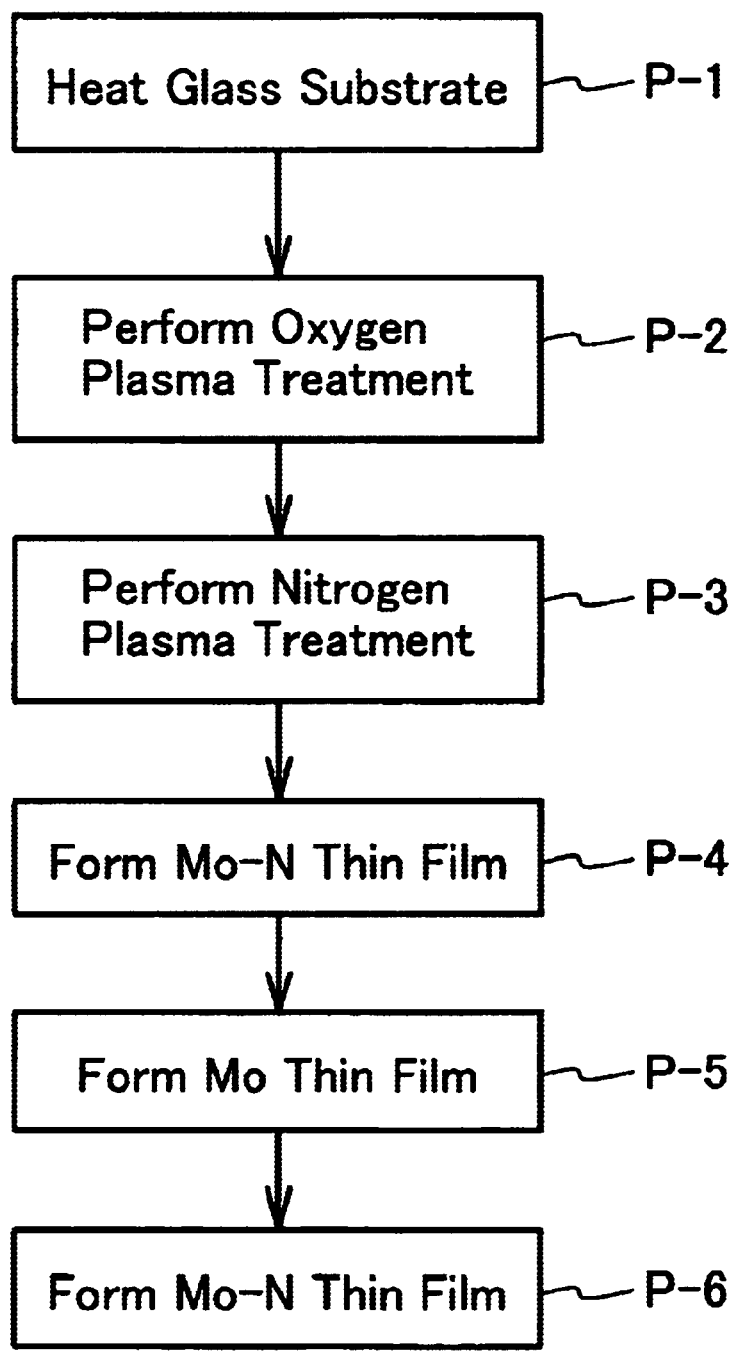
FIG. 2 is a schematic process diagram illustrating a method of forming the conductive thin film shown in FIG. 1 on an insulative substrate.

FIG. 2 is a schematic process diagram illustrating a method of forming the conductive thin film shown in FIG. 1 on an insulative substrate. In the following description, the reference numerals shown in FIG. 1 are used. First of all, the glass substrate 101 which has a surface cleaned with a basic solution by a publicly known method and has longer sides each having a length of 830 millimeters (hereinafter referred to as "mm"), shorter sides each having a length of 650 mm, and a thickness of 0.7 mm is heated with an infrared ray lamp in a vacuum for the purpose of degasfication. The set temperature for this heating is set as high as possible within a range where the set temperature for this heating can be balanced to a set temperature for deposition (Process P-1). Typically, the set temperature for the heating is set to 373K to 573K.

After that, in the vacuum chamber, the glass substrate 101 is exposed to oxygen plasma, whereby contaminants which adhere to the vicinity of the surface of the glass substrate 101 are removed through oxidization (P-2). In this case, more preferably, the oxygen plasma treatment is often excessively performed for the purpose of eliminating surface contamination. Consequently, oxygen having free bonding electrons remains on the surface of the glass substrate 101.

Subsequently, the glass substrate 101 is treated in nitrogen plasma to form the nitride layer 102 in which the free bonding electrons are fixed, thereby stabilizing the substrate surface (P-3).

Then, a mixture of argon and nitrogen ($Ar—N_2$) is introduced, and the thin layer of molybdenum nitride (a first Mo—N thin film) 103 is formed on the nitride layer 102 by sputtering with a target of Mo (P-4).

After that, the $Ar—N_2$ mixture is exhausted, and an argon gas is introduced and the Mo thin film 104 is formed by sputtering (P-5). Moreover, after that, an $Ar—N_2$ mixture is again used to form the molybdenum nitride thin layer (the second Mo—N thin film) 105 (P-6).

It is desirable that the conveyance of the heated insulative substrate to the deposition chamber be carried out with the vacuum atmosphere retained. Incidentally, the Mo thin film 104 was formed to have a thickness of 300 nanometers (hereinafter referred to as "nm"), and each of the first Mo—Ni thin film 103 and the second Mo—N thin film 105 was formed to have a thickness of 20 nm.

The Mo—N thin film contributes to an improvement in the adhesion between the Mo thin film 104 and the clean surface layer (the surface of the insulative substrate treated in nitrogen plasma after oxygen plasma treatment) 102 of the base substrate, as well as to an improvement in the adhesion between the Mo thin film 104 and a resist (a photoresist) coated by later patterning which is not shown. However, as to the adhesion to the base substrate, only the presence of the clean surface layer 102 is effective. The conductive material may be a material other than Mo. The material is, for example, one of molybdenum, aluminum, chromium, tungsten, copper and silver or an alloy contains molybdenum, aluminum, chromium, tungsten, copper and silver as main element, or a metallic material having properties equivalent to any of such materials.

After that, patterns such as interconnection lines are formed through each step of a photolithographic process such as resist application, pattern exposure, development, etching and resist peeling.

Figure 3:
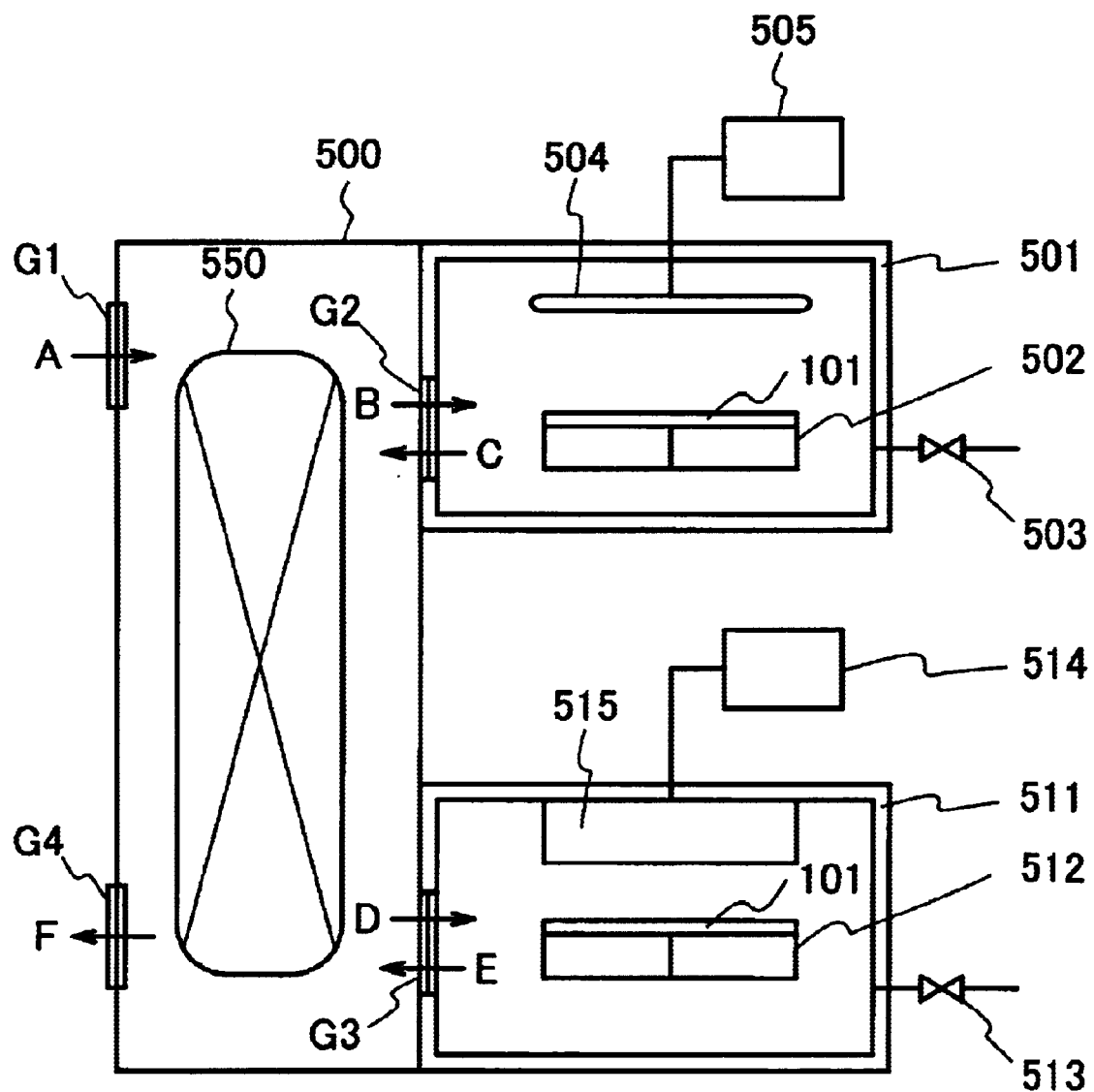
FIG. 3 is a diagrammatic view illustrating the schematic construction of deposition equipment for forming the conductive thin film according to the present invention.

FIG. 3 is a diagrammatic view illustrating the schematic construction of deposition equipment for forming the conductive thin film according to the present invention. This deposition equipment is constructed to form the surface-treated layer 102 of the insulative substrate 101 described previously in connection with FIG. 1, and to form over the insulative substrate 101 the Mo thin film 104, the first Mo—N film 103 and the second Mo—N thin film 105. The deposition equipment is made of a general plane-parallel plate type of plasma treatment apparatus and a planar type of magnetron sputtering apparatus.

The shown apparatus to be used for surface treatment and deposition on the insulative substrate 101 is made of a conveying chamber 500, a first vacuum chamber 501 and a second vacuum chamber 511. A conveyor device (such as a robot) is disposed in the conveying chamber 500. A substrate holding base 502 and an electrode 504 are disposed in the first vacuum chamber 501, and the first vacuum chamber 501 is also provided with a gas introducing part 503 and a power source 505. Similarly, a substrate holding base 512 and a sputtering electrode 515 are disposed in the second vacuum chamber 511, and a gas introducing part 513 and a power source 514 are secured to the second vacuum chamber 511. In FIG. 3, symbols G1, G2, G3 and G4 denote vacuum gates which can be opened and closed. Each of the vacuum gates G1 and G4 is a vacuum gate which separates the conveying chamber 500 from the outside (or a previous treatment device), the vacuum gate G2 is a vacuum gate which separates the conveying chamber 500 from the first vacuum chamber 501, and the vacuum gate G3 is a vacuum gate which separates the conveying chamber 500 from the second vacuum chamber 511.

The surface treatment of the insulative substrate 101 and the formation of the Mo thin film 104 and the first and second Mo—N thin films 103 and 105 are respectively effected in the independent vacuum chambers. The insulative substrate 101 is conveyed between the respective treatment chambers with the vacuum atmosphere being retained.

First of all, the insulative substrate 101 is introduced into the first vacuum chamber 501 through the conveying chamber 500 by conveyor means (not shown), and is disposed on the substrate holding base 502. At this time, the interior of the first vacuum chamber 501 in evacuated by an evacuation device (not shown).

After that, oxygen is introduced to be pressurized to a predetermined pressure, by the gas introducing part 503. Although the pressure of oxygen is, for example, 50 pascals (hereinafter referred to as Pa), the pressure of oxygen can be arbitrarily set according to conditions such as applied electric power and the volume and temperature of each of the vacuum chambers.

The applied power density for the electrode 504 is 4 kW/m$^2$, and the pressure of process gas is 50 Pa. After the pressure of oxygen has reached a desired value, electric power is supplied to the electrode 504 by the power source 505 to generate oxygen plasma, thereby oxidizing a surface of the insulative substrate 101. Consequently, the surface contaminants of the insulative substrate 101 are removed as oxides.

The insulative substrate (glass substrate) 101 subjected to the above-described surface cleaning treatment and the same kind of untreated substrate were comparatively analyzed by using a time-of-flight secondary ions mass spectroscope (TOF-SIMS). The measurement conditions were: kind of primary ion=Ga; acceleration voltage=15 kV; and measurement area =80×80 micrometers (hereinafter referred to as μm), and +ions were measured. The result is shown in Table 1.

TABLE 1

| MASS NUMBER | COMPOSITION RATIO OF SECONDARY IONS | STRENGTH OF $O_2$-PLASMA-TREATED SUBSTRATE RELATIVE TO Si SIGNAL (%) | STRENGTH OF UNTREATED SUBSTRATE RELATIVE TO Si SIGNAL (%) |
|---|---|---|---|
| 27 | $C_2H_3$ | 7.47 | 9.13 |
| 29 | $C_2H_5$ | 6.55 | 7.17 |
| 32 | $CH_6N$ | 0.20 | 0.71 |
| 39 | $C_3H_3$ | 4.26 | 5.20 |
| 41 | $C_3H_5$ | 9.46 | 10.33 |
| 44 | $C_2H_6N$ | 1.52 | 2.57 |
| 46 | $C_2H_8N$ | 1.46 | 2.54 |
| 55 | $C_4H_7$ | 4.40 | 4.71 |
| 57 | $C_4H_9$ | 2.69 | 3.23 |
| 74 | $C_4H_{12}N$ | 0.25 | 1.72 |
| 139 | $C_8H_{15}N_2$ | 0.08 | 0.77 |
| 28 | Si | 100.00 | 100.00 |

In Table 1, regarding each of $CH_6N$, $C_2H_6N$, $C_2H_8N$, $C_4H_{12}N$ and $C_8H_{15}N_2$, the strength of oxygen plasma treatment (in Table 1, "$O_2$-PLASMA-TREATED SUBSTRATE") relative to Si signals is very small compared to the untreated substrate. In other words, it is apparent that the adsorption of organic substances which contain nitrogen is particularly reduced.

The removal of these impurity contamination by the above-described plasma treatment contributes to an improvement in the adhesion to the base substrate. In general, this oxidization treatment is excessively performed to remove the surface contamination of the insulative substrate as completely as possible. At this time, oxygen atoms are adsorbed to the surface of the insulative substrate, but since the substrate itself is an oxide ($SiO_2$), a large part of the substrate has free bonding electrons and the surface of the substrate becomes unstable. For this reason, subsequently to the above-described oxygen plasma treatment, the surface of the insulative substrate 101 is treated with nitrogen plasma.

The procedure of this nitrogen plasma treatment is specifically as follows. An Ar-30% $N_2$ gas (Ar—$N_2$ gas) in which $N_2$ gas is mixed with Ar gas by 30% is introduced up to a predetermined pressure by the gas introducing part 503 of the first vacuum chamber 501. Although in this example the pressure of the Ar-30% $N_2$ gas is 60 Pa, the pressure can be arbitrarily set by those skilled in the art.

The applied power density for the electrode 504 is 5 kW/m$^2$, and the pressure of process gas is 60 Pa. After the pressure of the Ar-30% $N_2$ gas has reached to the predetermined value, electric power is supplied to the electrode 504 by the power source 505 to generate Ar—N$_2$ plasma, thereby nitriding the surface of the insulative substrate 101. Incidentally, any kind of gas that can generate nitrogen plasma can be used as a gas to be introduced.

The insulative substrate 101 whose surface is nitrided is conveyed from the first vacuum chamber 501 to the second vacuum chamber 511 by a conveyor 550 of the conveying chamber 500 with the vacuum atmosphere being retained, and is disposed on the substrate holding base 512 of the second vacuum chamber 511. At this time, the interior of the second vacuum chamber 511 is evacuated by an evacuation device (not shown).

After that, an Ar-30% N$_2$ gas (Ar—N$_2$ gas) is introduced up to a predetermined pressure by the gas introducing part 513. Although in this example the pressure of the Ar-30% N$_2$ gas is 0.2 Pa, the pressure can be arbitrarily set by those skilled in the art. An applied power density for a target is 30 kW/m$^2$, and the pressure of process gas is 0.2 Pa.

After the pressure of the Ar—N$_2$ gas has reached to the predetermined value, electric power is supplied to the sputtering electrode 515 on which a Mo target is mounted, by the power source 514, thereby sputtering Mo from the target to the insulative substrate 101. At this time, a magnetic field suited to magnetron discharge is formed on the surface of the sputtering electrode 515 by a permanent magnet unit (not shown).

At this time, nitrogen contained in the process gas forms the nitrogen-containing Mo film (hereinafter referred to as the Mo—N thin film) 103 on the insulative substrate 101 together with Mo particles which fly toward the insulative substrate 101 by being sputtered from the target. After the Mo—N thin film 103 has been formed up to a predetermined thickness, the process gas is replaced with Ar gas and sputtering is again performed, thereby forming the Mo thin film 104 on the insulative substrate 101.

Furthermore, the process gas is again replaced with Ar—N$_2$ gas, to form the second Mo—N thin film 105 on the insulative substrate 101. After that, the insulative substrate 101 is conveyed from the second vacuum chamber 511 to the conveying chamber 500, and is conveyed from the conveying chamber 500 for the next treatment process by conveyor means (not shown).

Evaluation of the adhesion of the Mo thin film treated and deposited in the above-described manner to the insulative substrate was performed by using a scratch test. This evaluation method is a method of applying a load through a diamond indentor to the thin film on which the Mo thin film is deposited, while vibrating the insulative substrate in a plane. The radius of curvature of the tip of the diamond indentor is 5 μm.

The load applied during the occurrence of deformation or scratches of the thin film is set as a critical load, which is regarded as the reference of adhesion. It can be determined that the larger the critical load, the higher the adhesion. Evaluation of the adhesion of a resist to the Mo thin film was performed by measuring the contact angle of pure water. It can be determined that as the contact angle becomes smaller, wettability becomes better and the adhesion becomes superior.

Figure 4:
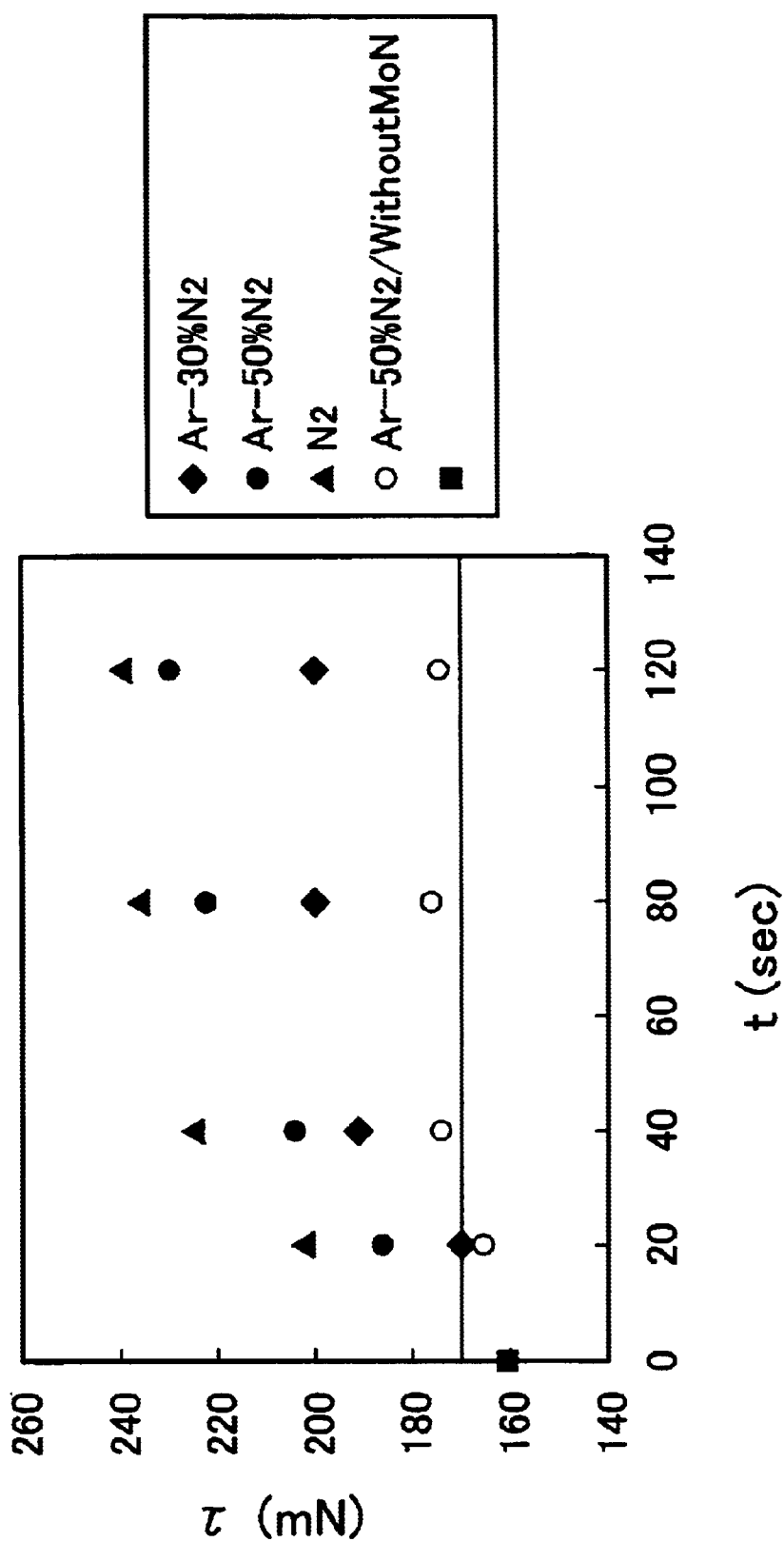
FIG. 4 is an explanatory view of the result of measurement of critical load during a scratch test performed on a Mo thin film.

FIG. 4 is an explanatory view of the result of measurement of critical load during a scratch test performed on the Mo thin film. In FIG. 4, when a critical load τ is 170 milli-newtons (mN) or more, the peeling of the thin film does not occur in practical terms.

In this case, for evaluation of the adhesion of the Mo thin film 104 on the insulative substrate 101, after the deposition of the Mo thin film 104, the insulative substrate 101 was taken out of the second vacuum chamber 511 and was subjected to a scratch test. In addition, an insulative substrate on which the Mo—N thin film 103 was not formed was evaluated as a comparative example. In addition to the above-described deposition using Ar-30% N$_2$ gas as process gas (in FIG. 4, plotted as black diamond-shaped dots), deposition using only N$_2$ gas (in FIG. 4, plotted as black triangular dots) and deposition using an Ar-50% N$_2$ process gas (in FIG. 4, plotted as black round dots) were performed. Moreover, evaluation was performed on the treatment of an insulative substrate on which no Mo—N thin film was formed, with an Ar-50% N$_2$ process gas (in FIG. 4, plotted as Ar-50% N$_2$ Without MoN: white round dots), and evaluation was also performed on a related art insulative substrate on which a Mo thin film was deposited after heating (in FIG. 4, plotted as only heating: a black square dot).

In addition, when the surface-treated layer (cleaned surface) 102 was formed, analysis of elements was performed in the depth direction of each of the insulative substrates by Auger electron spectroscopy (AES). Moreover, as to each of the layers of the Mo—N thin films between which the layer of the Mo thin film was interposed, depth-direction analysis was performed by AES. Moreover, for the purpose of evaluating the adhesion of the Mo thin film 104 to the resist, after the completion of formation of the Mo—N thin film 105, each of the insulative substrates was taken out and the contact angle of pure water was measured.

As shown in FIG. 4, in each of the treatments with the process gases of Ar-30% N$_2$ and only N$_2$, its effect was observed even for a treatment time of 20 seconds (sec), and in the treatment with Ar-30% N$_2$ in particular, if the treatment time is 40 sec or more, a sufficient critical load can be obtained. Accordingly, it can be seen that as the period is prolonged, the effect becomes higher.

It can also be seen that the higher the proportion of nitrogen in the mixture of Ar and N$_2$, the larger the effect. The black rectangular dot indicates the critical load of a reference sample which was taken out after it had been only heated. As compared with the insulative substrate on which the Mo—N thin film 103 was not formed, the insulative substrates on each of which the Mo—N thin film 103 was respectively formed are superior in adhesion, but it can be seen that a sufficient effect can be obtained with only the N$_2$ surface-treated layer 102.

Part of the results obtained by analyzing this surface-treated layer 102 by AES in the direction of a depth d (nm) are shown in Table 2. Table 2 shows the results of analysis of cases in which Ar-30% N$_2$ gas, Ar-50% N$_2$ gas, and N$_2$ gas are respectively used, as well as the result of a comparative example which is a related-art case in which Ar gas is used.

TABLE 2

| KIND OF GAS | DEPTH d FROM SURFACE (nm) | | |
|---|---|---|---|
| | 0 | 5 | 15 |
| Ar-30% N$_2$ | 10 | 6 | 2 |
| Ar-50% N$_2$ | 13 | 7 | 3 |
| N$_2$ | 21 | 10 | 3 |
| Ar (Comparative Example) | — | — | — |

In Table 2, the nitrogen concentrations are expressed in mol % (atomic fraction). It can be seen from the results shown in Table 2 that as the nitrogen concentration in a gas to be used becomes higher, a layer of higher nitrogen concentration can be formed. In addition, as the distance from the surface increases, the nitrogen content decreases. As a matter of course, a significant amount of nitrogen was not detected from the insulative substrate subjected to the treatment with only Ar. And FIG. 4 shows even Ar-30% $N_2$ gas is effective, so the nitrogen concentration on the surface is required 10 mol % or over.

Then, to verify the adhesion of the second Mo—N thin film 105 to the resist, the contact angle of pure water on the second Mo—N thin film 105 was measured. The results of this measurement is shown in Table 3. Table 3 similarly shows the results of measurement of cases in which Ar-30% $N_2$ gas, Ar-50% $N_2$ gas, and $N_2$ gas are respectively used, as well as the result of measurement of a comparative example which is a related-art case in which Ar gas is used (i.e., a case in which the second Mo—N thin film 105 is absent).

TABLE 3

| KIND OF GAS | CONTACT ANGEL φ (DEG) |
| --- | --- |
| Ar-30% $N_2$ | 22 |
| Ar-50% $N_2$ | 16 |
| $N_2$ | 12 |
| Ar (WITHOUT Mo-N LAYER) | 35 |

As shown in Table 3, it can also be seen that the higher the proportion of nitrogen in the mixture of Ar and $N_2$, the larger the effect. As a reference example, there is shown the case in which the second Mo—N thin film 105 was not formed (the case in which the Mo thin film 104 was deposited by sputtering in Ar gas but the second Mo—N thin film 105 was not deposited). From the results shown in Table 3, it can be seen that in the case where the second Mo—N thin film 105 is formed on the Mo thin film 104, the contact angle can be reduced and, therefore, the adhesion of the second Mo—N thin film 105 to the resist can be increased.

Moreover, the nitrogen concentrations in insulative substrates on each of which the second Mo—N thin film 105 was formed were analyzed in the depth direction by AES. The results of this analysis are shown in Table 4.

TABLE 4

| DEPTH d FROM SURFACE (nm) | 0 | 10 | 30 |
| --- | --- | --- | --- |
| NITROGEN CONCENTRATION c (mol %) | 15 | 12 | — |

Table 4 shows the results of analysis of the insulative substrates each formed by using Ar-50% $N_2$ gas as a process gas. Since the target thickness of the second Mo—N thin film 105 was 20 nm, nitrogen components were detected on the surface of each of the insulative substrates and at the bottom of a hole formed to a depth of 10 nm from the surface, but no significant quantities of nitrogen components were detected at the bottom of a hole formed to a depth of 30 nm from the surface. In this embodiment, the conductive material is Mo, however, one of aluminum, chromium, tungsten, copper and silver or an alloy contains molybdenum, aluminum, chromium, tungsten, copper and silver as main element is also available. Particularly, copper and silver did not have the good adhesion on the glass substrate. That is caused from the affinity to oxygen. So it is effective to use this invention, including the process that dangling bond on the glass substrate will be terminated by said nitrogen plasma process, like Mo. In case of aluminum, it is better than pure aluminum that using alloy target added titanium or silicon as alloy element in order to keep aluminum nitride minimum level. An embodiment in which the above-described insulative substrate is applied to a thin film transistor type liquid crystal display element will be described below.

Figure 5:
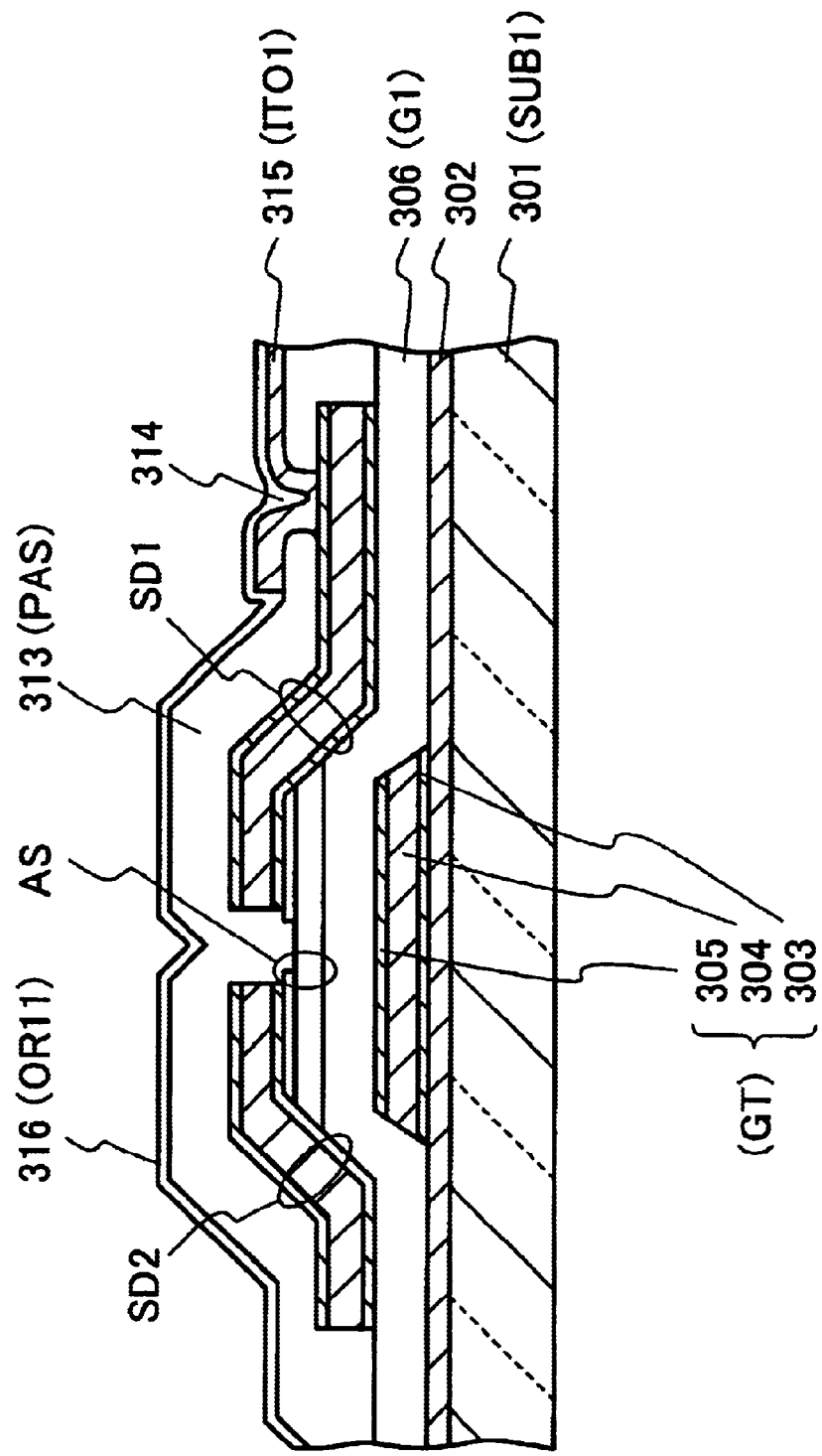
FIG. 5 is a diagrammatic cross-sectional view illustrating the essential portion of an example of the structure of a thin film transistor substrate (TFT substrate) of a liquid crystal display element manufactured according to the present invention.

FIG. 5 is a diagrammatic cross-sectional view illustrating the essential portion of an example of the structure of a thin film transistor substrate (TFT substrate) of a liquid crystal display element manufactured according to the present invention, and specifically shows a thin film transistor (TFT) portion of the substrate.

Referring to FIG. 5, a glass substrate 301 (generally called SUB 1) is used as an insulative substrate which constitutes the liquid crystal display element. This glass substrate 301 has a nitride layer 302 formed on its inner surface (the surface of the glass substrate 301 that is opposed to a substrate (not shown): the surface of the glass substrate 301 between which and a color filter substrate a liquid crystal layer is interposed). A first Mo—N thin film 303, a Mo thin film 304 and a second Mo—N thin film 305 which constitute a gate electrode GT are deposited in that order in a stacked manner over the nitride layer 302. This gate electrode GT is formed at the same time as a gate line (not shown).

The upper surface of the gate electrode GT is covered with silicon nitride (SiN) which forms a gate insulating film 306 (GI). A semiconductor layer AS overlies the gate insulating film 306 (GI) above the gate electrode GT. The semiconductor layer AS is made of an amorphous silicon (a-Si) layer and an overlying amorphous silicon ($n^+$a-Si) layer doped with phosphorus as an impurity.

The shown thin film transistor portion has a source or drain electrode SD1 and a drain or source electrode SD2 which are in contact with the amorphous silicon ($n^+$a-Si) layer of the semiconductor layer AS. Each of the electrodes SD1 and SD2 is formed of a thin film in which a first Mo—N thin layer, a Mo thin layer and a second Mo—N thin layer are stacked in that order.

The source or drain electrode SD1 and the drain or source electrode SD2 are covered with a passivation layer 313 (PAS) which is suitably made of SiN, and a pixel electrode 315 (ITO1) is formed to be connected to the source or drain electrode SD1 through a through-hole 314 formed in the passivation layer 313. An alignment film ORI1 which is in direct contact with the liquid crystal is formed over the entire glass substrate 301 as the uppermost layer.

As shown in FIG. 5, each of the gate electrode (line), the source or drain electrode SD1 and the drain or source electrode SD2 is formed of the thin film in which the first Mo—N thin layer, the Mo thin layer and the second Mo—N thin layer are stacked in that order.

Thus, the adhesion of each of the electrodes (lines) to a base (the glass substrate 301 in the case of the gate electrode or line GT, or the semiconductor layer AS and the gate insulating film 306 (GI) in the case of the source or drain electrode SD1 or the drain or source electrode SD2) is improved, and adhesion to a resist for patterning is also improved.

Consequently, it is possible to restrain the peeling of the gate electrode (line) GT or other similar stacked film structure from the glass substrate 301 or its underlying thin film, and in addition, adhesion to a resist is improved in a photolithographic technique for etching treatment By adopting this construction, patterning for lines or electrodes becomes accurate and a manufacturing yield factor is improved, whereby it is possible to provide a liquid crystal display element having high reliability and a large-sized screen.

An embodiment of a method of manufacturing a thin film transistor substrate of a liquid crystal display element having the structure described above in connection with FIG. 5 will be described below with reference to FIGS. 6A to 6M.

FIGS. 6A to 6M are schematic process diagrams illustrating one embodiment of a method of manufacturing a thin film transistor substrate which constitutes a thin film transistor type liquid crystal display element and serves as an insulative substrate on which to form a conductive thin film according to the present invention. FIGS. 6A to 6M show the process in order.

Figure 6A:
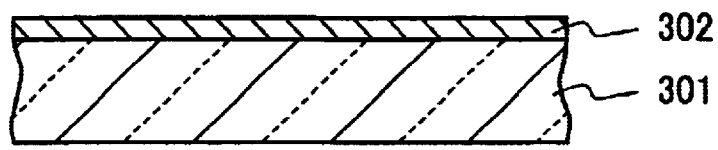
FIGS. 6A to 6M are schematic process diagrams illustrating one embodiment of a method of manufacturing a thin film transistor substrate which constitutes a thin film transistor type liquid crystal display element and serves as an insulative substrate on which to form a conductive thin film according to the present invention.
Figure 6B:
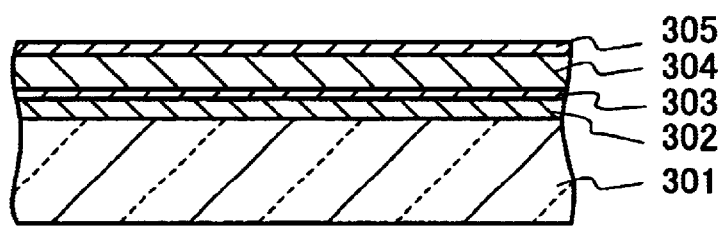

First of all, as shown in FIG. 6A, the clean surface layer (surface-treated layer) 302 which is made of a nitride film formed by oxygen plasma treatment and nitrogen plasma treatment is provided on the glass substrate 301 by using equipment of the type described above with reference to FIG. 3. This glass substrate is conveyed to a sputtering treatment chamber (the second vacuum chamber 511 shown in FIG. 3) in a vacuum retained, and a film having a three-layer structure made of the first Mo—N thin film 303, the Mo thin film 304 and the second Mo—N thin film 305 is continuously deposited by sputtering (FIG. 6B).

Figure 6C:
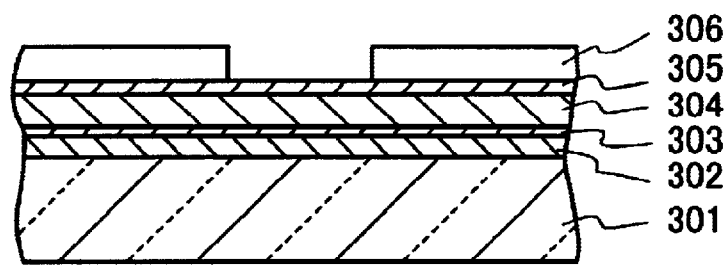

A resist 306 is applied to this glass substrate, and the resist 306 is exposed and developed and an opening is patterned into the shape of a gate electrode (line) (FIG. 6C).

Figure 6D:
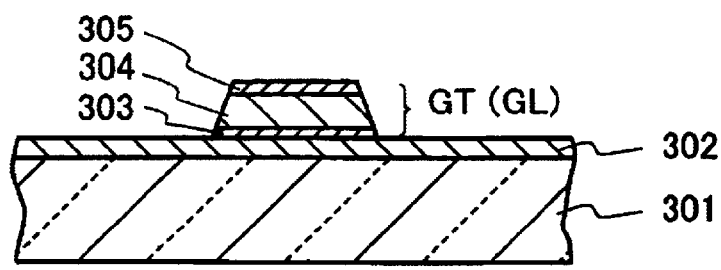

Wet etching is effected through this resist pattern to peel the resist 306 and form the gate electrode (line) 303 GT (GL) (FIG. 6D). The gate electrode 303 (GT) is shown in FIG. 6D.

Figure 6E:
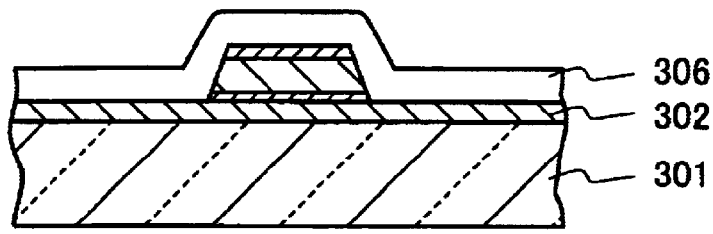
Figure 6F:
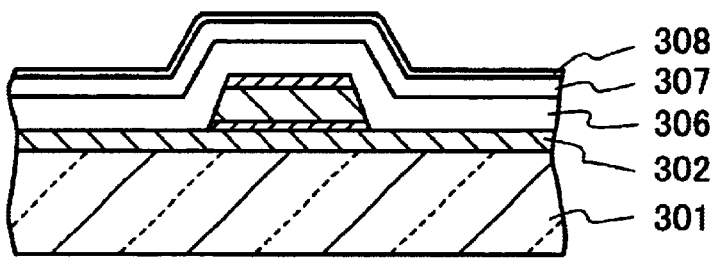

A SiN film 306 is formed as an insulating layer over the entire surface of the glass substrate 301 on which the gate electrode 303 (GT) has been formed (FIG. 6E). After that, an amorphous silicon (a-Si) layer 307 is formed as a semiconductor layer, and then an amorphous silicon (n$^+$a-Si) layer 308 doped with phosphorus as an impurity is continuously formed by plasma CVD (FIG. 6F).

Figure 6G:
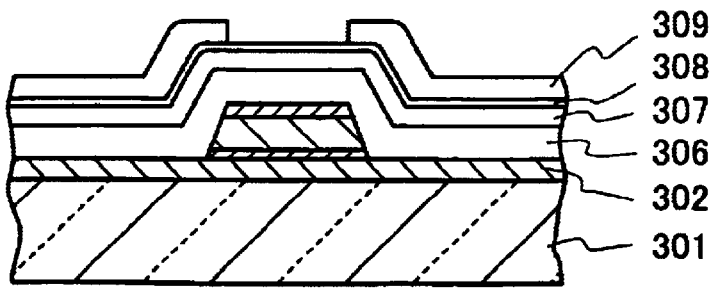
Figure 6H:
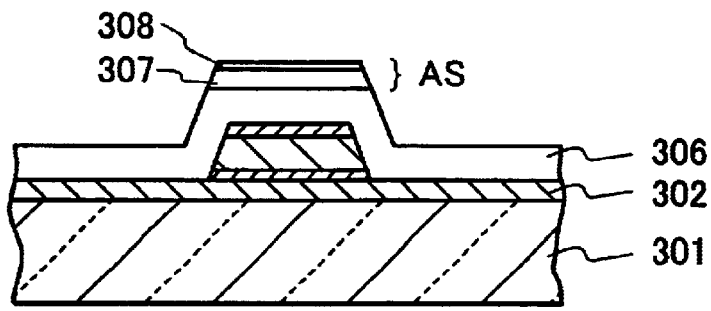

A resist is applied to the semiconductor film, and is exposed and developed to form an island pattern of a semiconductor (FIG. 6G). This island pattern is subjected to dry etching, thereby peeling the resist and forming an island of the semiconductor (FIG. 6H).

Figure 6I:
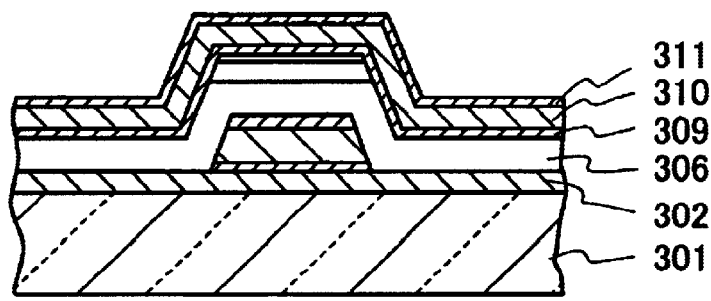

A film having a three-layer structure made of a Mo—N thin film 309, a Mo thin film 310 and a Mo—N thin film 311 is continuously deposited to cover the semiconductor island, by sputtering (FIG. 6I).

Figure 6J:
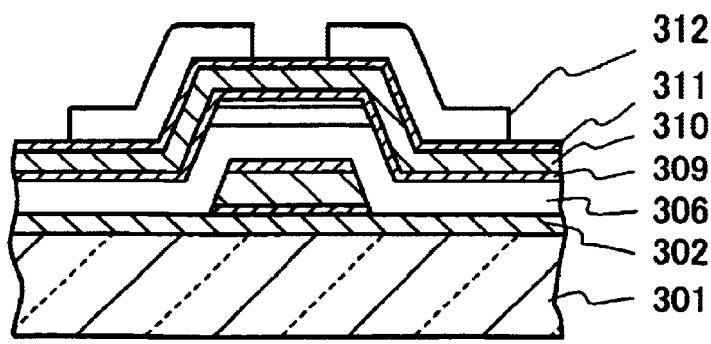
Figure 6K:
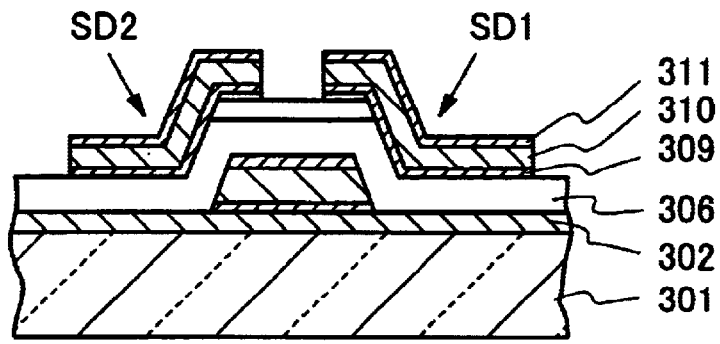

After that, the resist is applied, and is exposed and developed to form a source/drain separation pattern (FIG. 6J). Then, the three layers which are the Mo—N thin film 309, the Mo thin film 310 and the Mo—N thin film 311 are separated via this separation pattern by drying etching, and the n$^+$a-Si layer is etched to form the source electrode SD1 and the drain electrode SD2 through a resist peeling step (FIG. 6K).

Figure 6L:
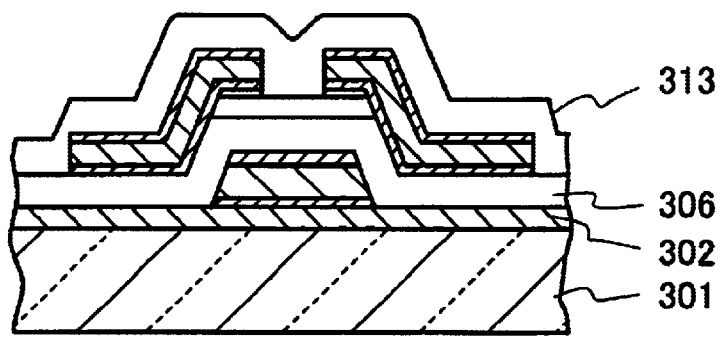

A SiN film 313 is formed by plasma CVD as an insulation film (passivation layer) to cover the source electrode SD1 and the drain electrode SD2 (FIG. 6L).

Figure 6M:
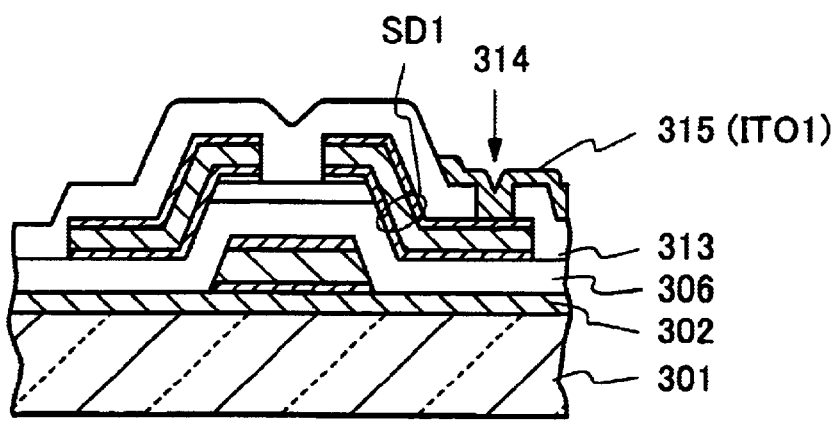

Then, a contact hole 314 is formed in the passivation layer 313 through steps such as resist application, exposure, development, dry etching and resist peeling, and a thin film which serves as the pixel electrode 315 (ITO) connected to the source electrode SD1 via the contact hole 314 is formed so that plural pixel electrodes 315 (ITO1) are separately disposed in the respective pixels (FIG. 6M).

A transparent electrode which constitutes the pixel electrode 315 (ITO1) is formed by sputtering with indium tin oxide (ITO).

In this construction, the pixel electrode 315 (ITO1) is connected through the contact hole 314 to the three-layer thin film made of the Mo—N thin film 309, the Mo thin film 310 and the Mo—N thin film 311 which constitute the source electrode SD1, but a far firmer connection can be established owing to the presence of the Mo—N thin film 311 than direct connection to the Mo layer 310. Another advantage is that the value of the electric resistance of the Mo—N thin film 311 is comparatively small. As another typical case, it is also available that the Mo—N thin film 311 is formed after making contact hole 314, later, sputtering the ITO thin film 315. In this case, the Mo—N thin film 311 makes contact with the Mo thin film 310 at the contact hole area only.

After that, an alignment film made of polyimide is formed as the uppermost layer for direct contact with the liquid crystal, whereby the thin film transistor substrate (active substrate) shown in FIG. 5 is obtained.

Incidentally, to confirm the advantages of the present invention, similar thin film transistor substrates were fabricated without using the above-described surface treatment of the insulative substrate or the above-described three-layer structure of the source electrode and the drain electrode according to the present invention. However, the patterning of resists was defective or the peeling of a deposited thin film itself occurred, so that no practical thin film transistor substrates were obtained.

A thin film transistor type liquid crystal display element to which the present invention is applied as well as a typical construction of a liquid crystal display device using such liquid crystal display element will be described below. Incidentally, as described above, the present invention is not limited to a vertical electric field type of active matrix liquid crystal display element having two insulative substrates each provided with pixel-forming electrodes or to a simple matrix liquid crystal display element, and can also be applied to the formation of lines or electrodes for a lateral electric field type of active matrix liquid crystal display element having pixel-forming electrodes on either one of its substrates (a thin film transistor substrate, or an active matrix substrate). The present invention is not limited to such a liquid crystal display element, and can similarly be applied to interconnection patterns or electrodes of highly integrated semiconductor devices.

Figure 7:
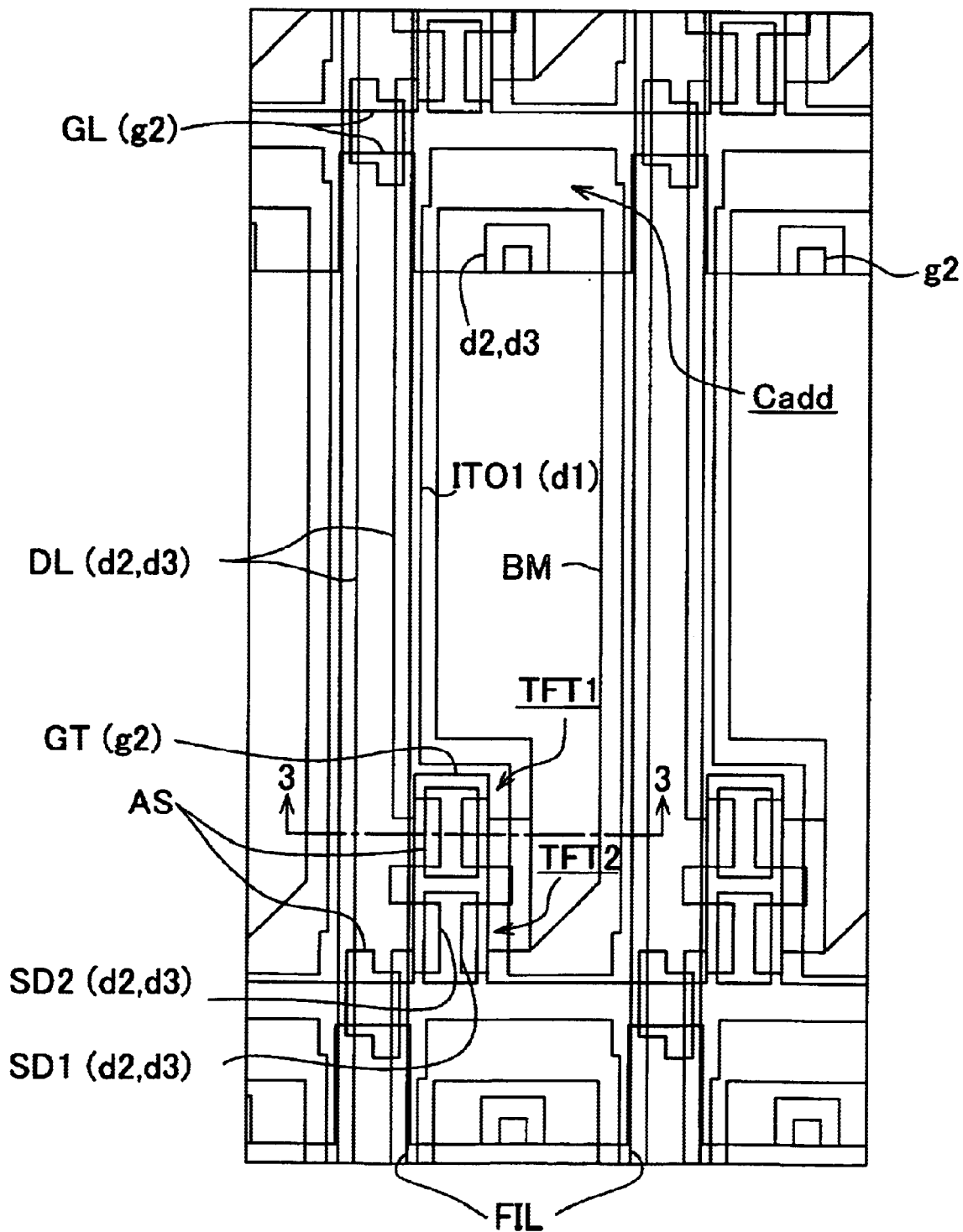
FIG. 7 is a plan view illustrating the constructions of one pixel and the urrounding portion of a liquid crystal display element which constitute the liquid crystal isplay device according to the present invention.

FIG. 7 is a plan view illustrating the constructions of one pixel and the surrounding portion of a liquid crystal display element which constitute the liquid crystal display device according to the present invention. Incidentally, FIG. 7 is a view of the construction of the vicinity of one pixel in a so-called TN type of active matrix liquid crystal display device. Each pixel is disposed in an intersection area (a region surrounded by four signal lines) of two adjacent scanning signal lines (gate signal lines or horizontal signal lines) GL and two adjacent video signal lines (drain signal lines or vertical signal lines) DL.

Each pixel includes thin film transistors TFT, a transparent pixel electrode ITOI and a holding capacitive element Cadd. The scanning signal lines GL are disposed to be extended in the column direction and to be juxtaposed in the row direction. The video signal lines DL are disposed to be extended in the row direction and to be juxtaposed in the column direction. In FIG. 7, two thin film transistors TFT are formed for each pixel, but there is also a liquid crystal display device in which one thin film transistor TFT is formed for each pixel.

An insulative substrate having common electrodes and color filters (a glass substrate: a color filter substrate (a CF substrate)) is stuck to an insulative substrate constructed in this manner (a glass substrate: a thin film transistor substrate (a TFT substrate)) with a liquid crystal being interposed therebetween, thereby assembling the liquid crystal display element. Each of the TFT and CF substrates has a thickness of approximately 0.7 mm.

Figure 8:
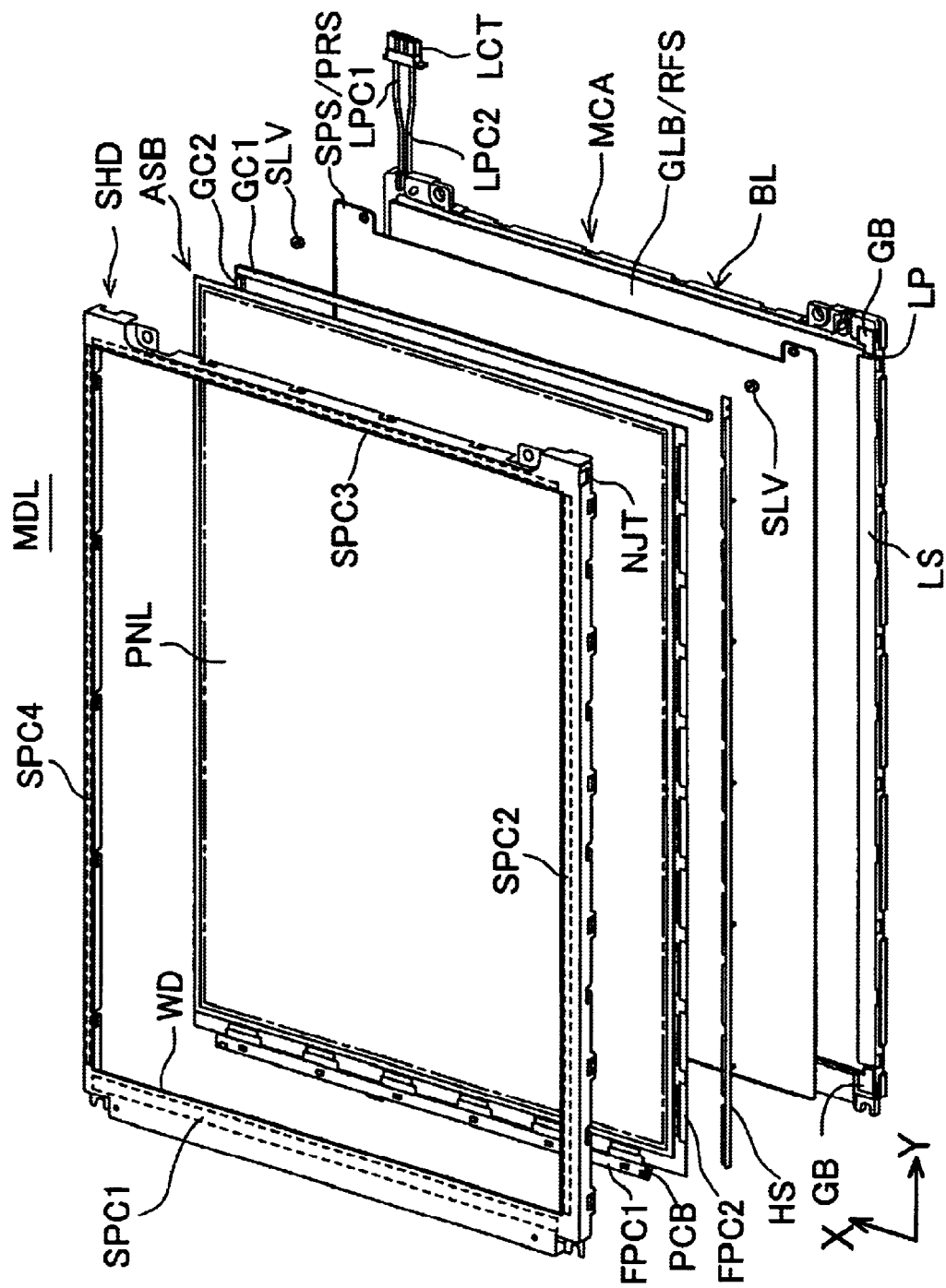
FIG. 8 is an exploded perspective view illustrating an example of the construction of a liquid crystal display device using an liquid crystal display element according to the present invention.

FIG. 8 is an exploded perspective view illustrating an example of the construction of a liquid crystal display device using an liquid crystal display element according to the present invention. Symbol ABS denotes a construction in which a driver circuit board is mounted on a liquid crystal display element PNL, and a construction in which optical sheets such as a diffusion sheet and a prism sheet and members such as a backlight are incorporated in the liquid crystal display element ABS having the driver circuit board is called a liquid crystal display module. FIG. 8 shows the liquid crystal display module. A liquid crystal display module MDL is constructed as follows.

In FIG. 8, Symbol SHD denotes a shield case made of a metal sheet (also called a metal frame), symbol WD a display window, symbols SPC1 to SPC4 insulating spacers, symbols FPC1 and FPC2 multilayered flexible circuit boards (symbols FPC1 and FPC2 denote a gate side circuit board and a drain side circuit board, respectively), symbol HS a frame ground made of a metal foil and disposed to provide electrical connection between the ground of the drain side circuit board FPC2 and the shield case SHD, symbol PCB denotes an interface circuit board, symbol ASB denotes an assembled liquid crystal display element having the driver circuit board, symbol PNL a liquid crystal display element (also called a liquid crystal display panel) which includes two transparent insulative substrates superposed on each other with driver ICs being mounted on either one of the two, symbols GC1 and GC2 rubber cushions, symbol PRS a prism sheet (in this embodiment, the prism sheet PRS is made of two prism sheets), symbol SPS a diffusion sheet, symbol GLB a light guide plate, symbol RFS a reflecting sheet, symbol SLV sleeves for securing the diffusion sheet SPS and the prism sheet PRS, symbol MCA a lower case (molded case) formed by integral molding, symbol LP a fluorescent tube (generally, a cold-cathode fluorescent lamp), symbol LS a reflector which reflects light of the fluorescent tube LP toward the light guide plate GLB, symbols LPC1 and LPC2 lamp cables, symbol LCT a connector for connection to an inverter, and symbols GB rubber bushes which support the fluorescent tube LP.

Symbol BL denotes a back light made of the fluorescent tube LP, the reflector LS, the light guide plate GLB, the reflecting sheet RFS. The backlight BL is disposed on the back surface of the liquid crystal display element PNL with the optical sheets such as the diffusion sheet SPS and the prism sheet PRS being interposed therebetween. This backlight BL is disposed to supply uniform light to the reverse surface of the liquid crystal display element PNL so that an observer who sees the liquid crystal display element PNL from the obverse surface thereof can recognize a variation in the optical transmissivity of the liquid crystal as a picture display.

As shown in FIG. 8, the lower case MCA, the backlight BL, the liquid crystal display element ASB having the driver circuit board, the shield case SHD and the like are stacked to assemble the liquid crystal display module MDL.

Figure 9:
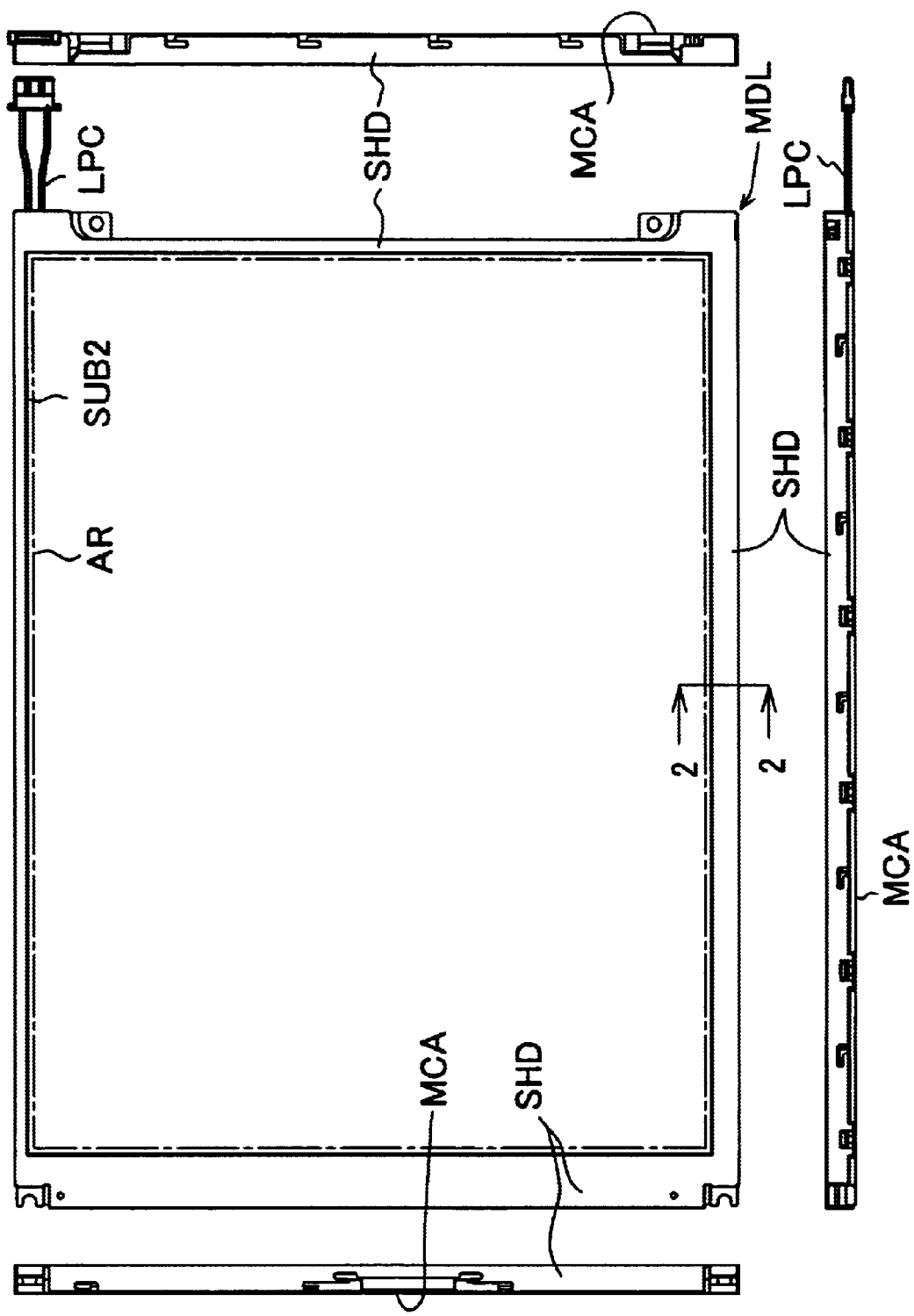
FIG. 9 is a front view and a side view of a liquid crystal display module MDL.

FIG. 9 is a front view and a side view of the liquid crystal display module MDL. The area exposed in the display window WD of the shield case SHD is an area (display area) AR in which to display a picture, and a deflector is provided on the outermost surface of the area AR. The shield case SHD and the molded case MCA are secured by the caulking of craws. The fluorescent tube LP which constitutes the backlight BL is housed in the interior of the upper side of the liquid crystal display module MDL, and lamp cables LPC for supplying electricity are led from the upper side.

Figure 10:
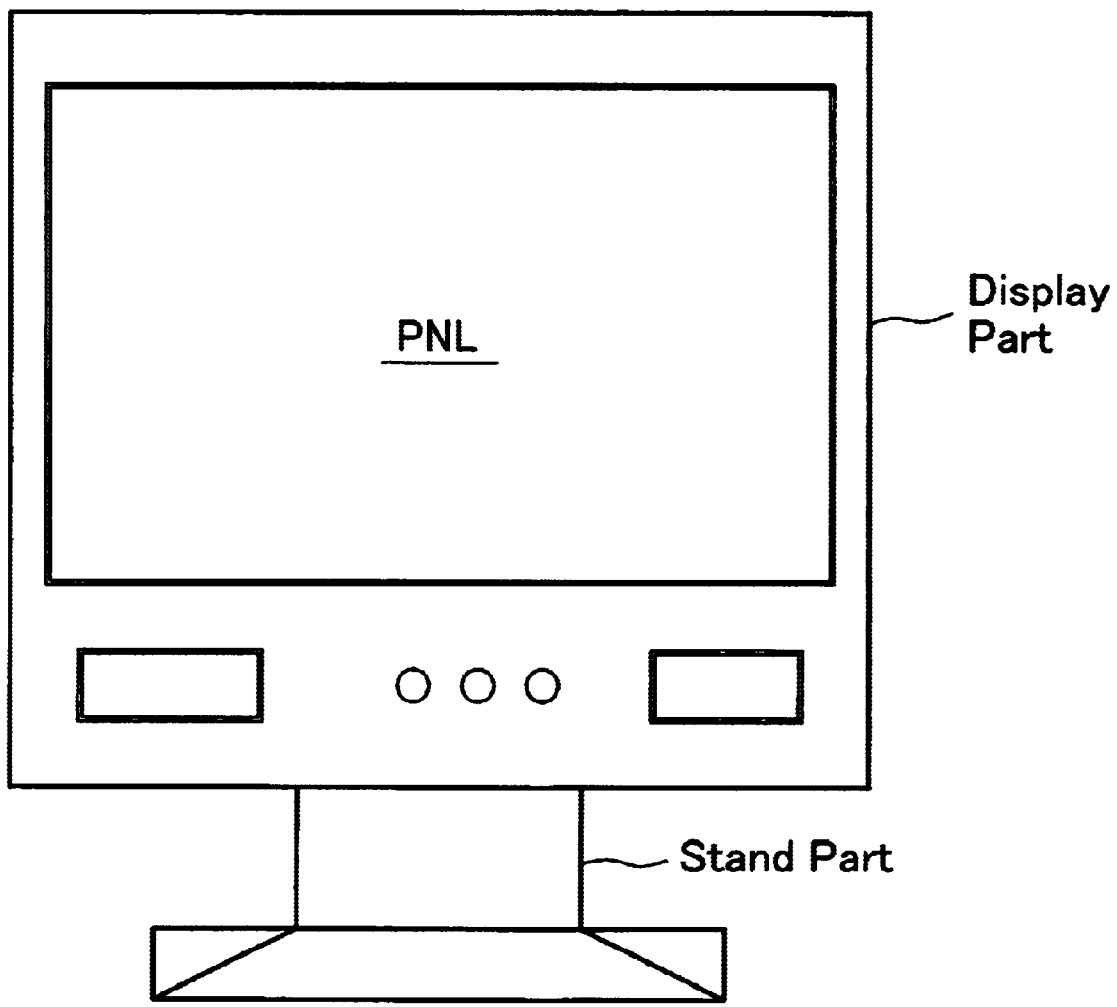
FIG. 10 is a view showing the external appearance of a display monitor which is one example of electronic equipment in which the liquid crystal display device according to the present invention is mounted.

FIG. 10 is a view showing the external appearance of a display monitor which is one example of electronic equipment in which the liquid crystal display device according to the present invention is mounted. This display monitor is made of a display part supported by a stand part, and the liquid crystal display element PNL is exposed in the display part to display a picture or a video image as visible data.

Incidentally, the main frame of an information processing unit or a television receiver circuit may be built in the stand part or the display part so that the display monitor can be used as a personal computer or a television receiver.

As is apparent from the foregoing description, according to the present invention, the adhesion of conductive thin films, for example, gate lines (electrodes), drain lines (electrodes) and other conductive thin films formed on a thin film transistor substrate, to an insulative substrate (base adhesion) and the connectivity between source electrodes and pixel electrodes are extremely improved and the lines and the electrodes can be formed far more reliably. Accordingly, it is possible to provide a high-quality liquid crystal display device which is improved in reliability and manufacturing yield factor.

In addition, even in the case of lines and electrodes in a liquid crystal display element of any type other than an LSI or thin film transistor type and those in other semiconductor devices, it is possible to achieve advantages similar to the above-described ones.

What is claimed is:

1. A liquid crystal display comprising:
    a glass substrate having a surface treated with an oxygen plasma;
    a protective layer formed in a region of said glass substrate along and including said surface by igniting a nitrogen plasma over said surface;
    a conductive layer formed over said protective layer, said conductive layer including a metallic element;
    a lower conductive layer provided between said surface and said conductive layer, said lower conductive layer having said metallic element and nitrogen atoms; and
    an upper conductive layer provided above said conductive layer; said upper conductive layer having said metallic element and nitrogen atoms;
    wherein said protective layer has a nitrogen concentration of about 10 mol % or more at said surface.

2. The liquid crystal display of claim 1, wherein said metallic element is molybdenum and said lower and upper conductive layers are formed of molybdenum-nitride.

3. The liquid crystal display of claim 1, wherein said metallic element includes at least one from the following group: molybdenum, aluminum, chromium, tungsten, silver, and copper.

4. The liquid crystal display of claim 1, wherein said metallic element includes two or more from the following group: molybdenum, aluminum, chromium, tungsten, silver, and copper.

5. The liquid crystal display of claim 1, further comprising:
    a plurality of pixels formed over said glass substrate, said plurality of pixels defined by a plurality of gate lines extending in a first direction and a plurality of drain lines extending in a second direction, wherein said first direction and said second direction are substantially orthogonal to each other; and a plurality of switching elements, wherein each switching element is associated to each pixel.

6. The liquid crystal display of claim 5, wherein said conductive layer corresponds to said gate lines.

7. A liquid crystal display, comprising:

a glass substrate, a plurality of gate lines formed on a surface of said glass substrate, said gate lines extending in a first direction;

a gate insulator formed over said plurality of gate lines;

a silicon layer formed on said gate insulator and disposed above said gate lines;

a plurality of drain lines formed over said glass substrate and said plurality of gate lines, said drain lines extending in a second direction, wherein said plurality of gate lines and said plurality of drain lines define a plurality of pixel parts arranged in a matrix;

a drain electrode and a source electrode fonned on said gate insulator and electrically coupled to said silicon layer;

a plurality of switching elements, each switching element corresponding to one of said plurality of pixel parts;

a passivation layer formed over said drain and source electrodes and said silicon layer, said passivation layer having a contact hole; and a pixel electrode formed on said passivation layer and coupled to said source electrode through said contact hole;

wherein said source electrode includes a first layer, a second layer, and a third layer stacked in sequence, said second layer containing said metallic element, and said first and third layers containing said metallic element and nitrogen atoms, said third layer being in contact with said pixel electrode;

wherein said surface of said glass substrate has been treated with an oxygen plasma to remove contaminants on said surface and provided with a nitrogen layer to stabilize said oxygen-plasma treated surface;

wherein said gate lines are formed of a conductive metal structure formed over said nitrogen layer, said conductive metal structure including:

a lower conductive layer formed on said nitrogen layer, said lower conductive layer being a metal alloy containing nitrogen, a middle conductive layer formed on said lower conductive layer, said middle conductive layer including a metallic element, and an upper conductive layer formed on said middle conductive layer formed on said middle conductive layer, said upper conductive layer being a metal alloy containing nitrogen;

wherein said surface has about 1.5% or less of the strength relative to Si+ of at least one kind of secondary ions selected from the group consisting of CH6N+, C2H6N+, C2H8N+, C4H12N+ and C8H15N2+, and about 3.5% or less of the sum of the strengths relat to Si+ of the secondary ions when the surface is analyzed by a time-of-flight secondary ions mass spectroscope.

8. The liquid crystal display of claim 7, wherein said metallic element includes at least one of the following metals: molybdenum, aluminum, chromium, tungsten, silver, and copper.

9. The liquid crystal display of claim 8, wherein said metallic element includes two or more from the following metals: molybdenum, aluminum, chromium, tungsten, silver, and copper.

10. The liquid crystal display of claim 7, wherein said oxygen-plasma treated surface said nitrogen layer thereat has a nitrogen concentration of about 10 mol % or more.

11. A liquid crystal display, comprising:

a glass substrate.

a plurality of gate lines formed on a surface of said glass substrate, said gate lines extending in a first direction;

a gate insulator formed over said plurality of gate lines;

a silicon layer formed on said gate insulator and disposed above said gate lines;

a plurality of drain lines formed over said glass substrate and said plurality of gate lines, said drain lines extending in a second direction, wherein said plurality of gate lines and said plurality of drain lines define a plurality of pixel parts arranged in a matrix;

a drain electrode and a source electrode formed on said gate insulator and electrically coupled to said silicon layer;

a plurality of switching elements, each switching element corresponding to one of said plurality of pixel parts;

a passivation layer formed over said drain and source electrodes and said silicon layer, said passivaton layer having a contact hole; and a pixel electrode formed on said passivation layer and coupled to said source electrode through said contact hole;

wherein said drain electrode includes a layer, a second layer, and a third layer stacked in sequence, said second layer containing said metallic element, and said first and third layers containing said metallic element and nitrogen atoms;

wherein said surface of said glass substrate has been treated with an oxygen plasma to remove contaminants on said surface and provided with a nitrogen layer to stabilize said oxygen-plasma treated surface;

wherein said gate lines are formed of a conductive metal structure formed over said nitrogen layer, said conductive metal structure including:

a lower conductive layer formed on said nitrogen layer, said lower conductive layer being a metal alloy containing nitrogen, a middle conductive layer formed on said lower conductive layer, said middle conductive layer including a metallic element, and an upper conductive layer formed on said middle conductive layer formed on said middle conductive layer, said upper conductive layer being a metal alloy containing nitrogen;

wherein said surface has about 1.5% or less of the strength relative to Si+ of at least one kind of secondary ions selected from the group consisting of CH6N+, C2H6N+, C2H8N+, C4H12N+ and C8H15N2+, and about 3.5% or less of the sum of the strengths relative to Si+ of the secondary ions when the surface is analyzed by a time-of-flight it secondary ions mass spectroscope.

12. A liquid crystal display, comprising:

a glass substrate, a plurality of gate lines formed on a surface of said glass substrate, said gate lines extending in a first direction;

a plurality of drain lines formed over said class substrate and said plurality of gate lines, said drain lines extending in a second direction, wherein said plurality of gate lines and said plurality of drain lines define a plurality of pixel parts arranged in a matrix; and a plurality of switching elements, each switching element corresponding to one of said plurality of pixel parts:

wherein said surface of said glass substrate has been treated with an oxygen plasma to remove contaminants on said surface and provided with a nitrogen layer to stabilize said oxygen-plasma treated surface;

wherein said gate lines are formed of a conductive metal structure formed over said nitrogen layer, said conductive metal structure including:

a lower conductive layer formed on said nitrogen layer, said lower conductive layer being a metal alloy containing nitrogen, a middle conductive layer formed on said lower conductive layer, said middle conductive layer including a metallic element, and an upper conductive layer formed on said middle conductive layer formed on said middle conductive layer, said upper conductive layer being a metal alloy containing nitrogen;

wherein said oxygen-plasma treated surface said nitrogen layer thereat has a nitrogen concentration between about 10 mol % and about 13 mol % inclusive;

wherein said surface has about 1.5% or less of the strength relative to Si+ of at least one kind of secondary ions selected from the group consisting of CH6N+, C2H6N+, C2H8N+, C4H12N+ and C8H15N2+, and about 3.5% or less of the sum of the strengths relative to Si+ of the secondary ions when the surface is analyzed by a time-of-flight secondary ions mass spectroscope.

* * * * *